United States Patent
Adachi

(10) Patent No.: US 8,199,455 B2
(45) Date of Patent: Jun. 12, 2012

(54) GLASS CERAMIC COMPOSITION, GLASS CERAMIC SINTERED BODY, AND MULTILAYER CERAMIC ELECTRONIC DEVICE

(75) Inventor: Hiroshige Adachi, Omihachiman (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 437 days.

(21) Appl. No.: 12/612,066

(22) Filed: Nov. 4, 2009

(65) Prior Publication Data
US 2010/0046137 A1     Feb. 25, 2010

Related U.S. Application Data

(63) Continuation of application No. PCT/JP2009/054389, filed on Mar. 9, 2009.

(30) Foreign Application Priority Data

Mar. 13, 2008   (JP) .................................. 2008-063619

(51) Int. Cl.
    *H01G 15/00*     (2006.01)
(52) U.S. Cl. ................ 361/301.4; 361/321.1; 361/321.4; 361/321.5; 361/303; 361/305
(58) Field of Classification Search ............... 361/321.1, 361/321.4, 321.5, 301.4, 303, 305
    See application file for complete search history.

(56) References Cited

U.S. PATENT DOCUMENTS

| | | | |
|---|---|---|---|
| 6,107,228 A | 8/2000 | Sugimoto et al. | |
| 6,108,192 A | 8/2000 | Sugimoto et al. | |
| 6,380,116 B1 | 4/2002 | Okamatsu et al. | |
| 6,458,734 B1 | 10/2002 | Sugimoto et al. | |
| 7,368,408 B2 * | 5/2008 | Mori et al. | 501/134 |
| 7,417,001 B2 * | 8/2008 | Mori et al. | 501/32 |
| 7,439,202 B2 * | 10/2008 | Mori et al. | 501/134 |
| 7,824,642 B2 * | 11/2010 | Moriya et al. | 423/331 |
| 8,097,350 B2 * | 1/2012 | Sugimoto et al. | 428/701 |

FOREIGN PATENT DOCUMENTS

| | | |
|---|---|---|
| JP | 11-228222 A | 8/1999 |
| JP | 11-310455 A | 11/1999 |

(Continued)

OTHER PUBLICATIONS

Written Opinion of the International Searching Authority, mailed Jun. 2, 2009.

Primary Examiner — Tuan T Dinh
Assistant Examiner — Hung Dang
(74) *Attorney, Agent, or Firm* — Dickstein Shapiro LLP

(57) ABSTRACT

A glass ceramic composition is provided which can be fired at a temperature of 1,000° C. or less to form a sintered body having a low relative dielectric constant, a small temperature coefficient of resonant frequency, a small change in capacitance before and after a loading test, a high Qf value, high electrical insulating reliability, and a high flexural strength. A glass ceramic composition forming glass ceramic layers laminated to each other in a multilayer ceramic substrate is also provided. The glass ceramic composition includes a first ceramic powder containing forsterite as a primary component; a second ceramic powder containing $SrTiO_3$ and/or $TiO_2$ as a primary component; a third ceramic powder containing $BaZrO_3$ as a primary component; a fourth ceramic powder containing $SrZrO_3$ as a primary component; and a borosilicate glass which contains $Li_2O$, $MgO$, $B_2O_3$, $SiO_2$, and ZnO, and also which contains at least one of CaO, BaO, and SrO.

20 Claims, 5 Drawing Sheets

FOREIGN PATENT DOCUMENTS

| | | |
|---|---|---|
| JP | 2000-344571 A | 12/2000 |
| JP | 2001-39765 A | 2/2001 |
| JP | 2001-080959 A | 3/2001 |
| JP | 2002-097072 A | 4/2002 |
| JP | 2007-302541 A | 11/2007 |
| JP | 2008-37739 | 2/2008 |
| WO | WO-2005/082806 A1 | 9/2005 |
| WO | WO-2008/018408 A1 | 2/2008 |

\* cited by examiner

US 8,199,455 B2

GLASS CERAMIC COMPOSITION, GLASS CERAMIC SINTERED BODY, AND MULTILAYER CERAMIC ELECTRONIC DEVICE

This is a continuation of application Serial No. PCT/JP2009/054389, filed Mar. 9, 2009, the entire contents of which is incorporated herein by reference.

TECHNICAL FIELD

The present invention relates to a glass ceramic composition containing a glass component so as to be fired at a low temperature, a glass ceramic sintered body obtained by firing the glass ceramic composition, and a multilayer ceramic electronic device formed by using this glass ceramic sintered body.

BACKGROUND ART

A multifunctional electronic device has been used in electronic apparatus as one effective measure for reducing the size of the apparatus. As the multifunctional electronic device, for example, a ceramic multilayer module may be mentioned.

The ceramic multilayer module has a multilayer ceramic substrate. Wiring conductors are embedded in the multilayer ceramic substrate to serve an electrical connection function and/or to form at least one passive device such as a capacitor and/or an inductor, and in addition, various electronic devices are mounted on the multilayer ceramic substrate.

According to the structure described above, although being compact in size, the ceramic multilayer module can be configured to have a multifunctional performance, and by the use of this ceramic multilayer module, the electronic apparatus can be reduced in size.

In addition, besides reducing the size as described above, there has been an increasing request for the electronic apparatus to work satisfactorily in a higher frequency band. Under the situation described above, a multilayer ceramic substrate thereof is desired to have superior high frequency characteristics in a ceramic multilayer module used in a high frequency band. More particularly, an insulating ceramic sintered body used as an insulating ceramic layer which forms part of a multilayer structure of the multilayer ceramic substrate has been desired to have superior high frequency characteristics.

As an insulating ceramic composition to form an insulating ceramic sintered body that fulfills the desire described above, a composition disclosed, for example, in Japanese Unexamined Patent Application Publication No. 2000-344571 (Patent Document 1) may be mentioned. In Patent Document 1, a three-component insulating ceramic composition including forsterite, calcium titanate, and spinel has been disclosed. According to Patent Document 1, this insulating ceramic composition has a Qf value of 38,000 GHz or more, which is represented by frequency (GHz)/dielectric loss (tan δ), and a temperature coefficient of the dielectric constant of −80 to +40 ppm/° C. in a more preferable composition range.

When a multilayer ceramic substrate of the above-described ceramic multilayer module is manufactured, a firing step is carried out. In this firing step, wiring conductors provided for the multilayer ceramic substrate are also simultaneously fired.

In order to use the ceramic multilayer module in a high frequency band without causing any problems, the wiring conductors provided for the multilayer ceramic substrate must first have a low electrical resistance. Hence, a metal, such as copper or silver, having a low electrical resistance must be used as a conductive component contained in the wiring conductors.

However, the metal, such as copper or silver, has a relatively low melting point. Hence, in order to obtain the multilayer ceramic substrate by firing it simultaneously together with wiring conductors containing the metal described above, an insulating ceramic composition forming insulating ceramic layers of the multilayer ceramic substrate must be a composition which can be fired at a low temperature, such as 1,000° C. or less.

In the case of the insulating ceramic composition described in Patent Document 1, a firing temperature of 1,140 to 1,600° C. has been disclosed, and hence a condition in which firing can be performed at a temperature of 1,000° C. or less cannot be satisfied.

In addition, in order to obtain a multilayer ceramic substrate which can work satisfactorily in a higher frequency band and which can achieve a higher wiring-conductor density, the dielectric constant of insulating ceramic layers which form the multilayer ceramic substrate must be decreased. Incidentally, a concrete value of the relative dielectric constant of the insulating ceramic sintered body which is obtained by firing the insulating ceramic composition described in Patent Document 1 has not been disclosed.

An insulating ceramic composition has been disclosed in Patent Document 2 which can be fired at a temperature of 1,000° C. or less, and has a low relative dielectric constant, which has more superior high frequency characteristics, that is, in more particulars, which can control the temperature characteristics of resonant frequency to be small, and which can obtain a higher Q value.

In Patent Document 2, a glass ceramic composition has been proposed which includes a first ceramic powder containing forsterite as a primary component; a second ceramic powder including at least one selected from the group consisting of a ceramic powder containing calcium titanate as a primary component, a ceramic powder containing strontium titanate as a primary component, and a ceramic powder containing titanium oxide as a primary component; and a borosilicate glass. In the glass ceramic composition described above, the borosilicate glass contains 3 to 15 percent by weight of lithium in the form of $Li_2O$, 30 to 50 percent by weight of magnesium in the form of $MgO$, 15 to 30 percent by weight of boron in the form of $B_2O_3$, 10 to 35 percent by weight of silicon in the form of $SiO_2$, 6 to 20 percent by weight of zinc in the form of $ZnO$, and 0 to 15 percent by weight of aluminum in the form of $Al_2O_3$.

In recent years, the thickness of ceramic layers forming a base member of a multilayer ceramic electronic device has progressively decreased, and on the other hand, the number of signals having a high voltage to be handled has increased. Accordingly, a material forming the ceramic layers has been increasingly required to have higher electrical insulating reliability.

In addition, concomitant with the decrease in thickness of the multilayer ceramic electronic device, the multilayer ceramic electronic device itself is also required to have a high flexural strength.

Patent Document 1: Japanese Unexamined Patent Application Publication No. 2000-344571

Patent Document 2: International Publication WO 2005/082806 pamphlet

DISCLOSURE OF INVENTION

Problems to be Solved by the Invention

Accordingly, an object of the present invention is to provide a glass ceramic composition which can be fired at a temperature of 1,000° C. or less to form a sintered body in which the relative dielectric constant is low, the high frequency characteristics are superior, the electrical insulating reliability can be further improved, and a high flexural strength can be obtained.

Another object of the present invention is to provide a glass ceramic sintered body which can be obtained by firing the above-described glass ceramic composition and a multilayer ceramic electronic device formed by using the above glass ceramic sintered body.

Means for Solving the Problems

In order to solve the technical problems described above, a glass ceramic composition of the present invention comprises the following structure.

That is, the glass ceramic composition of the present invention comprises:

(1) a first ceramic powder containing forsterite as a primary component;

(2) a second ceramic powder including a ceramic powder which contains strontium titanate as a primary component and/or a ceramic powder which contains titanium oxide as a primary component;

(3) a third ceramic powder containing $BaZrO_3$ as a primary component;

(4) a fourth ceramic powder containing $SrZrO_3$ as a primary component; and (5) a borosilicate glass.

The borosilicate glass powder contains 3 to 15 percent by weight of lithium in the form of $Li_2O$, 20 to 50 percent by weight of magnesium in the form of MgO, 15 to 30 percent by weight of boron in the form of $B_2O_3$, 10 to 35 percent by weight of silicon in the form of $SiO_2$, and 6 to 20 percent by weight of zinc in the form of ZnO, and also contains at least one additive component selected from the group consisting of calcium oxide, barium oxide, and strontium oxide.

When the content of the additive component contained in the borosilicate glass powder is represented by the percentage of the total weight of the glass, the lower limit of the content of the additive component is 5 percent by weight in total when calcium oxide, barium oxide, and strontium oxide are calculated in the form of CaO, BaO, and SrO, respectively, and as the upper limit of the content of the additive component, the content of calcium oxide is 15 percent by weight in the form of CaO, the content of barium oxide is 25 percent by weight in the form of BaO, and the content of strontium oxide is 25 percent by weight in the form of SrO.

With regard to the second ceramic powder in the glass ceramic composition, when the second ceramic powder includes the ceramic powder which contains strontium titanate as a primary component, the content thereof is in the range of 3 to 13 percent by weight in the form of $SrTiO_3$, and when the second ceramic powder includes the ceramic powder containing titanium oxide as a primary component, the content thereof is in the range of 0.3 to 10 percent by weight in the form of $TiO_2$.

The content of the third ceramic powder in the glass ceramic composition is in the range of 2 to 20 percent by weight, the content of the fourth ceramic powder is in the range of more than 2 to 20 percent by weight, and the content of the borosilicate glass powder is in the range of 3 to 20 percent by weight.

The present invention is also directed to a glass ceramic sintered body which is obtained by a process comprising the steps of: forming the above-described glass ceramic composition of the present invention into a predetermined shape; and performing firing at a temperature of 1,000° C. or less.

The present invention is also directed to a multilayer ceramic electronic device comprising: a plurality of glass ceramic layers laminated to each other; and wiring conductors provided in association with the glass ceramic layers. In this multilayer ceramic electronic device, the glass ceramic layers are each formed from the above-described glass ceramic sintered body of the present invention, and the wiring conductors contain copper or silver as a primary component.

Advantages

According to the glass ceramic composition of the present invention, firing can be performed at a temperature of 1,000° C. or less, and the glass ceramic sintered body obtained by this firing has superior chemical stability, a relatively low relative dielectric constant, a high Qf value, and a stable temperature coefficient ($\tau_f$) of resonant frequency.

When a multilayer ceramic electronic device is formed using the glass ceramic sintered body of the present invention, copper or silver can be used as a primary component of wiring conductors included in the electronic device, and as a result, a multilayer ceramic electronic device preferably used for high frequency applications can be formed.

Since the borosilicate glass powder included in the glass ceramic composition of the present invention contains at least one of calcium oxide, barium oxide, and strontium oxide as an additive component, the electrical insulating reliability of a glass ceramic sintered body obtained by firing can be improved. Although not being exactly understood, the mechanism of improving the insulating reliability has been conceived as follows.

The glass ceramic sintered body of the present invention basically includes a $Mg_2SiO_4$ crystal phase of the first ceramic powder and an Mg—Si—B—Zn—Li-based glass phase of the borosilicate glass powder and also has a fine structure in which a $Li_2(Mg,Zn)SiO_4$-based crystal phase is precipitated in the Mg—Si—B—Zn—Li-based glass phase. In this glass ceramic sintered body, for example, when $TiO_2$ is contained as the second ceramic powder, crystal phases of $MgTiO_3$ and $MgTi_2O_5$ are further precipitated, and it has been conceived that an $AB_2O_5$ type crystal phase, such as $MgTi_2O_5$, causes degradation in insulating reliability. Accordingly, when Ca, Ba, and/or Sr is added beforehand to the glass phase, the above element reacts with $TiO_2$ to form an $ABO_3$ type crystal phase, such as $CaTiO_3$, $BaTiO_3$, or $SrTiO_3$, so that the $AB_2O_5$ type crystal phase is not likely to be formed. That is, since the $ABO_3$ type crystal phase, such as $CaTiO_3$, $BaTiO_3$, or $SrTiO_3$, is precipitated preferentially to the $AB_2O_5$ type crystal phase, such as $MgTi_2O_5$, as a result, precipitation of the $AB_2O_5$ type crystal phase, such as $MgTi_2O_5$, is suppressed, so that the degradation in insulating reliability is suppressed.

Accordingly, when a multilayer ceramic electronic device is formed using the glass ceramic sintered body of the present invention, the thicknesses of glass ceramic layers included therein can be decreased.

In addition, since the glass ceramic composition of the present invention includes the fourth ceramic powder containing $SrZrO_3$ as a primary component, the crystallinity degree of a glass ceramic sintered body obtained by firing the above glass ceramic composition can be improved, and hence the flexural strength of the glass ceramic sintered body can be improved. Accordingly, when a multilayer ceramic electronic device is formed using the glass ceramic sintered body of the present invention, the thickness of the multilayer ceramic capacitor can be advantageously decreased.

In the glass ceramic composition of the present invention, the content of the borosilicate glass powder can be decreased to 20 percent by weight or less. Since the cost of a borosilicate glass is relatively high, when the content of the borosilicate glass powder can be decreased, it is advantageous in terms of cost. In addition, when the content of the borosilicate glass powder is decreased, the reaction between the second ceramic powder as an additive and the glass can be easily controlled, and the control of the temperature coefficient ($\tau_f$) of resonant frequency by the additive can be easily performed. In addition, the plating resistance of the glass ceramic sintered body and productivity of the multilayer ceramic electronic device can be improved.

Figure 1:
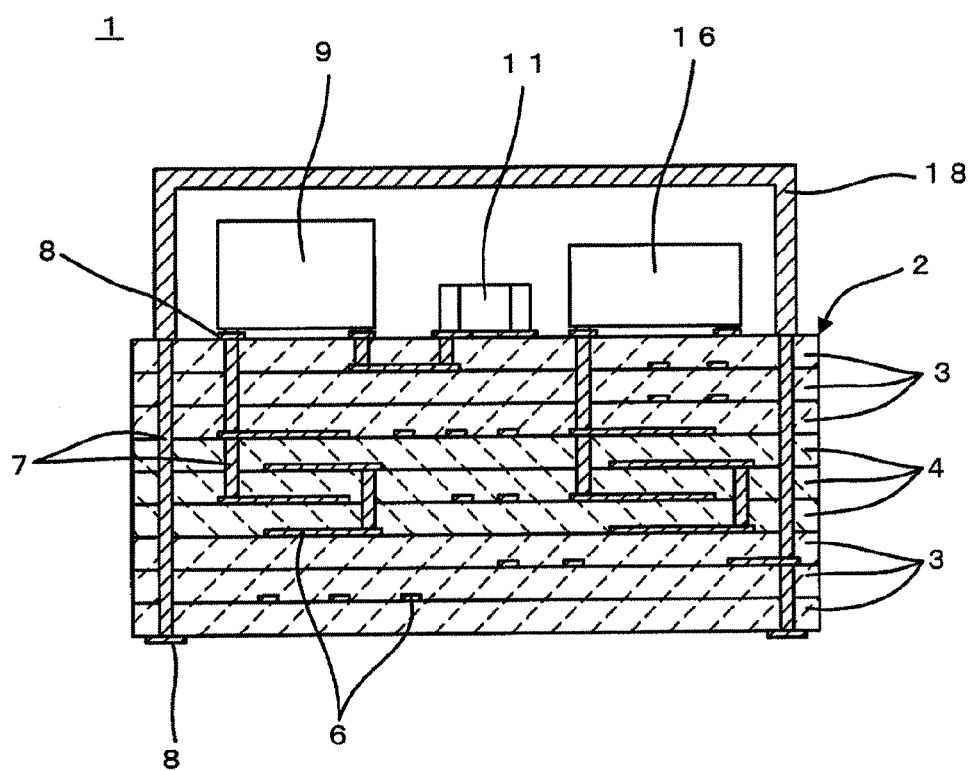
FIG. 1 is a cross-sectional view showing a ceramic multilayer module 1 as one example of a multilayer ceramic electronic device which is formed by using a glass ceramic composition of the present invention.

| Reference Numerals | |
|---|---|
| 1 | ceramic multilayer module |
| 2 | multilayer ceramic substrate |
| 3 | glass ceramic layer |
| 4 | high dielectric ceramic layer |
| 6 | internal conductive film |
| 7, 43, 45, 46, 50, 52, 56, 57, 59 | via hole conductor |
| 8 | external conductive film |
| 21 | LC filter |
| 23 | component main body |
| 24 to 27 | terminal electrode |
| 28 to 40 | ceramic green sheet |
| 41, 44, 58, 60 | coil pattern |
| 42, 48, 49, 54, 55, 61 | lead pattern |
| 47, 51, 53 | capacitor pattern |

BEST MODES FOR CARRYING OUT THE INVENTION

A glass ceramic composition of the present invention comprises a first ceramic powder containing forsterite ($Mg_2SiO_4$) as a primary component, a second ceramic powder including a ceramic powder which contains strontium titanate ($SrTiO_3$) and/or titanium oxide ($TiO_2$) as a primary component, a third ceramic powder containing $BaZrO_3$ as a primary component, a fourth ceramic powder containing $SrZrO_3$ as a primary component, and a borosilicate glass. The fourth ceramic powder which contains $SrZrO_3$ as a primary component and the composition of the borosilicate glass are features of the present invention.

The borosilicate glass contains 3 to 15 percent by weight of lithium in the form of $Li_2O$, 20 to 50 percent by weight of magnesium in the form of MgO, 15 to 30 percent by weight of boron in the form of $B_2O_3$, 10 to 35 percent by weight of silicon in the form of $SiO_2$, and 6 to 20 percent by weight of zinc in the form of ZnO. This borosilicate glass preferably has a composition in which a $Li_2(Mg,Zn)SiO_4$ crystal phase can be precipitated since a higher Q value and higher reliability (humidity resistance) can be realized in a sintered body.

Lithium contained in the borosilicate glass is a constituent element of $Li_2(Mg,Zn)SiO_4$ and functions to decrease the sintering temperature of the glass ceramic composition. The reasons the content of lithium in the form of $Li_2O$ in the borosilicate glass is restricted in the range of 3 to 15 percent by weight are that when the content is less than 3 percent by weight, densification cannot be performed at a temperature of 1,000° C. or less, the $Li_2(Mg,Zn)SiO_4$ crystal phase is not precipitated in the sintered body, and the Qf value thereof decreases, and that on the other hand, when the content is more than 15 percent by weight, the $Li_2(Mg,Zn)SiO_4$ crystal phase is not precipitated in the sintered body, the Qf value is low, and the chemical stability and insulating reliability are both degraded.

The magnesium contained in the borosilicate glass is a constituent element of the $Li_2(Mg,Zn)SiO_4$ crystal phase and functions to decrease the melting point in glass formation. The reasons the content of magnesium in the form of MgO is restricted in the borosilicate glass in the range of 20 to 50 percent by weight are that when the content is less than 20 percent by weight, the $Li_2(Mg,Zn)SiO_4$ crystal phase is not precipitated in the sintered body, and the Qf value thereof decreases, and that on the other hand, when the content is more than 50 percent by weight, devitrification of the glass occurs.

The term "devitrification" indicates that a glass is partly crystallized. Since crystallization in the case of a specific glass composition is likely to occur at a point at which the melting of a raw material powder is changed due to the quenching thereof, "devitrification" occurs; however, depending on cooling conditions and the like, the amount of crystal to be precipitated is not stabilized. Hence, the sintering properties of the glass ceramic composition and the dielectric characteristics of the glass ceramic sintered body may be influenced thereby in some cases. In sintering a glass ceramic, a decrease in glass viscosity occurs in some cases right before crystallization. Also in this case, it is believed that the sintering properties of the glass ceramic composition and the dielectric characteristics of the glass ceramic sintered body are influenced when the glass is partly crystallized, and the amount thereof is not stable, and when the crystallization significantly occurs, the glass ceramic composition may not be sintered in some cases.

The reasons the content of boron in the form of $B_2O_3$ the borosilicate glass is restricted in the range of 15 to 30 percent by weight are that when the content is less than 15 percent by weight, vitrification is difficult to occur, and that on the other hand, when the content is more than 30 percent by weight, the humidity resistance is degraded, the crystallinity degree also decreases, the Qf value decreases, and the chemical stability and insulating reliability are both degraded in the sintered body.

The term "vitrification is difficult to occur" indicates that since the content of a network forming oxide (such as $SiO_2$ or $B_2O_3$) is small, an amorphous state (glass state) cannot be obtained. When the content of a network forming oxide is small, a mere calcined body is only formed.

Silicon contained in the borosilicate glass is a constituent element of the $Li_2(Mg,Zn)SiO_4$ crystal phase. In the borosilicate glass, the reasons the content of silicon in the form of $SiO_2$ is restricted to the range of 10 to 35 percent by weight are that when the content is less than 10 percent by weight, the chemical stability of the sintered body is low, and the glass may be devitrified in some cases, and that on the other hand, when the content is more than 35 percent by weight, sintering is difficult to perform at a temperature of 1,000° C. or less.

Zinc contained in the borosilicate glass is a constituent element of the $Li_2(Mg,Zn)SiO_4$ crystal phase and functions to increase the Qf value of the sintered body. In the borosilicate glass, the reasons the content of zinc in the form of ZnO is restricted to the range of 6 to 20 percent by weight are that when the content is less than 6 percent by weight, no $Li_2(Mg,Zn)SiO_4$ forms in the sintered body, a decrease in Qf value, degradation in chemical stability, and degradation in insulating reliability may occur in some cases, and that on the other hand, when the content is more than 20 percent by weight, the Qf value decreases, and the chemical stability and insulating reliability are degraded.

In order to improve the electrical insulating reliability, a least one additive component selected from the group consisting of calcium oxide, barium oxide, and strontium oxide is added to the borosilicate glass included in the glass ceramic composition of the present invention.

When the content of the additive component is represented by the ratio occupied in the borosilicate glass powder, the lower limit of the content of the additive component is 5 percent by weight in total when calcium oxide, barium oxide, and strontium oxide are calculated in the form of CaO, BaO, and SrO, respectively. As the upper limit of the content of the additive component, the content of calcium oxide is 15 percent by weight in the form of CaO, the content of barium oxide is 25 percent by weight in the form of BaO, and the content of strontium oxide is 25 percent by weight in the form of SrO.

The reason the content of the additive components is set to 5 percent by weight or more is that when the content is less than that, the effect of improving the insulating reliability cannot be substantially obtained. The reason the content of calcium oxide as the additive component is set to 15 percent by weight or less in the form of CaO is that when the content is more than that, the Qf value decreases. The reason the content of barium oxide as the additive component is set to 25 percent by weight or less in the form of BaO is that when the content is more than that, sintering is difficult to perform. The reason the content of strontium oxide as the additive component is set to 25 percent by weight or less in the form of SrO is that when the content is more than that, the Qf value decreases.

In addition, when calcium oxide, barium oxide, and strontium oxide are compositely added as an additive component, a more significant effect of improving the insulating reliability can be obtained.

In the glass ceramic composition of the present invention, 3 to 20 percent by weight of the borosilicate glass powder described above is included.

The reason the borosilicate glass powder is included in an amount of 3 percent by weight or more is that when the content is less than 3 percent by weight, densification may not be performed at a temperature of 1,000° C. or less in some cases. On the other hand, the reasons the content of the borosilicate glass powder is set to 20 percent by weight or less are that when the content is more than 20 percent by weight, the cost is disadvantageously increased since the amount of a high cost glass is increased, and in addition, the Qf value of the obtained sintered body may decrease in some cases since the ratio of the crystal phase described above tends to relatively decrease.

As long as the content of the borosilicate glass powder is 3 percent by weight or more, a smaller content is more preferable, and for example, even 15 percent by weight or less, which is included in the range of 20 percent by weight or less, is sufficient. As the content of the borosilicate glass powder is decreased, the reaction between the second ceramic powder as the additive and the glass can be easily controlled, and the temperature characteristics of resonant frequency can be more easily adjusted by the additive.

In the glass ceramic composition of the present invention, 54 to 77 percent by weight of the first ceramic powder is preferably included. When the content of the first ceramic powder is less than 54 percent by weight, the relative dielectric constant of the sintered body tends to decrease, and the Qf value is not likely to increase, and on the other hand, when the content is more than 77 percent by weight, the sintering properties tend to be degraded.

The forsterite included as a primary component in the first ceramic powder preferably has a molar ratio of MgO to $SiO_2$, a $MgO/SiO_2$ ratio, of 1.92 to 2.04. The reason for this is that when the $MgO/SiO_2$ ratio is less than 1.92 or more than 2.04, the chemical stability of the sintered body may be degraded in some cases. In addition, although including forsterite ($Mg_2SiO_4$) as a primary crystal phase, the first ceramic powder may not include any other crystal phases or may include a very small amount of at least one of $SiO_2$ (quartz), MgO, and $MgSiO_2$ (steatite) as another crystal phase.

In the first ceramic powder, the content of impurities other than the forsterite is more preferably 5 percent by weight or less. The reasons for this are that when the content of the impurities is more than 5 percent by weight, the Qf value of the sintered body decreases, and further, the chemical stability is degraded. As the impurities, for example, there may be mentioned $Al_2O_3$, $B_2O_3$, CaO, $Fe_2O_3$, $MnO_2$, NiO, $SnO_2$, SrO, ZnO, $P_2O_5$, $TiO_2$, $ZrO_2$, $Li_2O$, $Na_2O$, and $K_2O$.

The medium value D50 of the first ceramic powder is preferably 1 μm or less. The reason for this is that when this medium value D50 is more than 1 μm, densification may not be performed in the case in which the content of the borosilicate glass powder is in the range of 3 to 20 percent by weight.

In the glass ceramic composition of the present invention, the second ceramic powder functions so as to adjust the temperature characteristics of resonant frequency in the sintered body.

When the second ceramic powder is a ceramic powder containing $SrTiO_3$ as a primary component, the content thereof is set to 3 to 13 percent by weight. The reasons for this are that when the content is less than 3 percent by weight, the $\tau_f$ increases in the sintered body, and that on the other hand, when the content is more that 13 percent by weight, the $\tau_f$ increases, and the change in capacitance before and after a loading test increases in the sintered body.

When the second ceramic powder is a ceramic powder containing $TiO_2$ as a primary component, the content is set to 0.3 to 10 percent by weight. Although the ceramic powder containing $TiO_2$ as a primary component has an effect of increasing the crystallinity degree, the content is set to 0.3 percent by weight or more in order to sufficiently obtain this effect. However, when the content is more than 10 percent by weight, the relative dielectric constant increases, the $\tau_f$ increases, and the change in capacitance before and after a loading test increases in the sintered body.

In the ceramic powder containing strontium titanate as the second ceramic powder, a strontium titanate having a molar ratio of SrO to $TiO_2$, a $SrO/TiO_2$ ratio, of 0.92 to 1.05 is preferable.

When the $SrO/TiO_2$ ratio is more than 1.05, unreacted SrO may remain in the form of a carbonate or the like in some cases, and the Qf value may decrease, and/or the humidity resistance may be degraded due to the reaction with the glass component. In addition, the crystal phase of $Sr_2TiO_4$ or the like may be precipitated in some cases. When $Sr_2TiO_4$ or the like is precipitated, the addition amount is inevitably increased in order to adjust the TCC of the whole system, and as result, the Qf value may decrease in some cases since the absolute value of the temperature coefficient (TCC) of the dielectric constant thereof is small as compared to that of $SrTiO_3$.

When the $SrO/TiO_2$ ratio is less than 0.92, $SrTiO_3$ and $TiO_2$ may be precipitated in some cases. Since $TiO_2$ as the second ceramic powder is additionally added in some cases, when the addition amounts of $SrTiO_3$ and $TiO_2$ are each adjusted, problems may not occur in terms of electrical properties; however, from a manufacturing process point of view, the control is made complicated by the adjustment of the addition amounts of $SrTiO_3$ and $TiO_2$ which is performed each time, and as a result, the cost may be increased.

In the case described above, the ceramic powder containing strontium titanate as a primary component more preferably contains 1 percent by weight or less of impurities other than the strontium titanate. As the impurities, impurities at a raw material stage or impurities during a manufacturing process may be mentioned. Examples are $Nb_2O_5$, $Fe_2O_3$, and $Na_2O$. When the amount of a single impurity or the amount of all impurities is more than 1 percent by weight, the Qf value may decrease in some cases.

The specific surface area of the ceramic powder containing strontium titanate as a primary component is more preferably in the range of 1.5 to 7.5 $m^2/g$. The reasons for this are that when the specific surface area is less than 1.5 $m^2/g$, sintering may be difficult to perform, and that on the other hand, when the specific surface area is more than 7.5 $m^2/g$, the Qf value may decrease in some cases since the reactivity with the glass increases.

The ceramic powder containing strontium titanate as a primary component preferably has an integral intensity of or more of an x-ray diffraction peak to the $SrTiO_3$ (222) plane of the ceramic powder. The reason for this is that when the integrated intensity is less than 1,000, the reactivity with the glass increases, and the Qf value may decrease in some cases since the crystallinity of $SrTiO_3$ is not so high.

The glass ceramic composition of the present invention further includes, besides the above-described first and second ceramic powders, a third ceramic powder containing $BaZrO_3$ as a primary component, and a fourth ceramic powder containing $SrZrO_3$ as a primary component.

In the glass ceramic composition, 2 to 20 percent by weight of the third ceramic powder containing $BaZrO_3$ as a primary component is included. The reasons for this are that although the third ceramic powder has an effect of reducing the change in capacitance before and after a loading test, when the content thereof is less than 2 percent by weight, the effect of reducing the change in capacitance cannot be sufficiently obtained in the sintered body, and that on the other hand, when the content is more than 20 percent by weight, the relative dielectric constant may increase, and the change in capacitance may conversely increase in some cases.

The glass ceramic composition contains more than 2 and up to 20 percent by weight of the fourth ceramic powder containing $SrZrO_3$ as a primary component. Although the fourth ceramic powder has an effect of improving the flexural strength of the sintered body, when the content is 2 percent by weight or less, the effect of improving the flexural strength cannot be sufficiently obtained, and on the other hand, when the content is more than 20 percent by weight, the relative dielectric constant may increase in some cases.

The glass ceramic composition as described above can be fired at a temperature of 1,000° C. or less, and the sintered body obtained thereby has a $Mg_2SiO_4$ crystal phase precipitated as a primary phase and a $Li_2(Mg,Zn)SiO_4$ crystal phase precipitated as a subphase and is advantageously used to form a multilayer ceramic electronic device.

Figure 2:
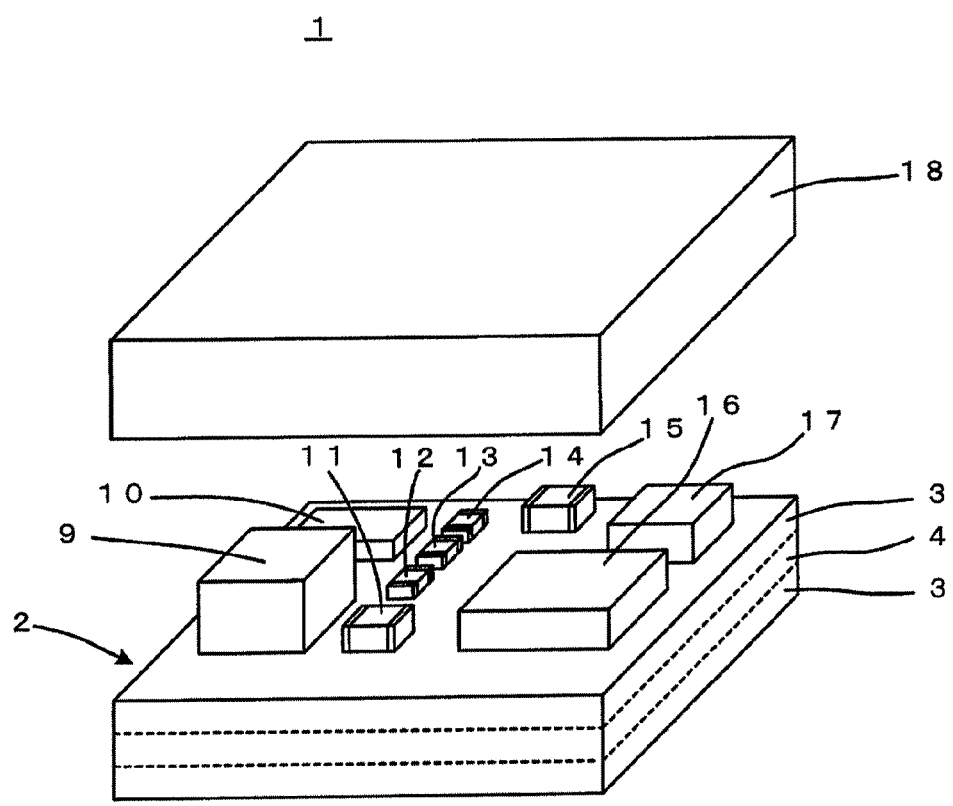
FIG. 2 is an exploded perspective view showing the ceramic multilayer module 1 shown in FIG. 1.

FIG. 1 is a cross-sectional view showing a ceramic multilayer module 1 as one example of a multilayer ceramic electronic device formed by using the glass ceramic composition of the present invention, and FIG. 2 is an exploded perspective view showing the ceramic multilayer module 1 shown in FIG. 1.

The ceramic multilayer module 1 has a multilayer ceramic substrate 2. The multilayer ceramic substrate 2 has a plurality of glass ceramic layers 3 laminated to each other and a plurality of high dielectric ceramic layers 4 laminated to each other, and the plurality of glass ceramic layers 3 are located so as to sandwich the plurality of high dielectric ceramic layers 4.

The glass ceramic layers 3 are each formed from a glass ceramic sintered body obtained by firing the glass ceramic composition of the present invention and has a relatively low relative dielectric constant, such as 10 or less.

On the other hand, the high dielectric ceramic layers 4 each have a composition containing, for example, barium titanate and a glass added thereto, and the relative dielectric constant is set to 15 or more and is preferably set to 30 or more.

The multilayer ceramic substrate 2 is provided with various wiring conductors. As the wiring conductors, typically, there may be mentioned internal conductive films 6 formed along specific interfaces between the ceramic layers 3 and 4, via hole conductors 7 extending to penetrate specific ceramic layers 3 and 4, and external conductive films 8 formed on outer surfaces of the multilayer ceramic substrate 2.

Among the internal conductive films 6 described above, some internal conductive films provided in association with the high dielectric ceramic layers 4 are disposed to obtain an electrostatic capacitance, so that a capacitor element is formed.

A plurality of electronic devices 9 to 17 is mounted on an upper surface of the multilayer ceramic substrate 2. Among the electronic devices 9 to 17 shown in the figure, for example, the electronic device 9 is a diode, the electronic device 11 is a multilayer ceramic capacitor, and the electronic device 16 is a semiconductor IC. These electronic devices 9 to 17 are electrically connected to specific external conductive films 8 formed on the upper surface of the multilayer ceramic substrate 2 and also form a circuit necessary for the ceramic multilayer module 1 in corporation with wiring conductors formed inside the multilayer ceramic substrate 2.

A conductive cap 18 to shield the electronic devices 9 to 17 is fixed on the upper surface of the multilayer ceramic substrate 2. The conductive cap 18 is electrically connected to specific ones of the via hole conductors 7 described above.

In addition, the ceramic multilayer module 1 is mounted on a mother board not shown in the figure by using specific external conductive films 8 formed on the lower surface of the multilayer ceramic substrate 2 as connection terminals.

The ceramic multilayer module 1 can be manufactured by using a known ceramic laminate integral firing technique.

That is, first, ceramic green sheets for the glass ceramic layers 3 are formed. In more particular, an organic vehicle composed of a binder resin and a solvent is added to the glass ceramic composition (that is, a raw material composition) of the present invention, so that a ceramic slurry is obtained. After this ceramic slurry is formed into sheets by a doctor blade method and is then dried, the dried slurry is punched out into sheets having a predetermined dimension, so that the ceramic green sheets are obtained. Next, in order to form wiring conductors, a conductive paste containing copper or silver as a primary component is applied to these ceramic green sheets to form desired patterns.

In addition, ceramic green sheets containing a high dielectric ceramic composition of a high dielectric constant material forming the high dielectric ceramic layers 4 are formed. In more particular, as the high dielectric ceramic composition, for example, one of the following (1) to (4) is prepared.

Figure 3:
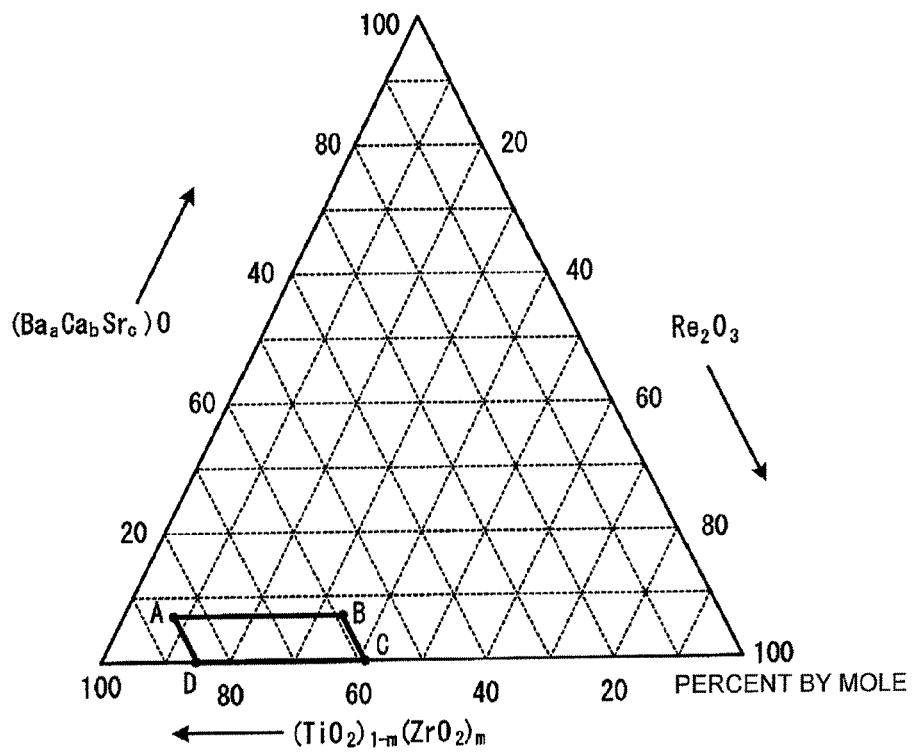
FIG. 3 is a ternary composition diagram showing a molar composition ratio (x, y, z) of a $x(Ba_aCa_bSr_c)O\text{-}y\{(TiO_2)_{1-m}(ZrO_2)_m\}\text{-}zRe_2O_3$ which is a primary component of a high dielectric constant material of a preferred example forming a high dielectric ceramic layer 4 of the ceramic multilayer module 1 shown in FIG. 1.

(1) A high dielectric ceramic composition including: a primary component represented by $x(Ba_aCa_bSr_c)O$-$y\{(TiO_2)_{1-m}(ZrO_2)_m\}$-$zRe_2O_3$ (in which the units of x, y, and z are each on a molar percent basis; $x+y+z=100$, $a+b+c=1$, $0 \leq b+c \leq 0.8$, and $0 \leq m \leq 0.15$ hold; and Re is at least one of rare earth elements) as disclosed in Japanese Unexamined Patent Application Publication No. 2001-80959, the primary component having the molar composition ratio (x,y,z) of $(Ba_aCa_bSr_c)O$, $\{(TiO_2)_{1-m}(ZrO_2)_m\}$, and $Re_2O_3$ within a region surrounded by point A (7,85,8), point B (7,59,34), point C (0,59,41), and point D (0,85,15) in a tertiary composition diagram shown in the accompanying FIG. 3 (however, a line between the point A and the point B is not included); a first subcomponent containing a $SiO_2$-based glass; and a second subcomponent containing Mn, in which when the amount of the primary component is set to 100 parts by weight, 0.1 to 25 parts by weight of the first subcomponent is included, and 0.5 to 20 parts by weight of the second subcomponent is included in the form of Mn.

(2) A high dielectric ceramic composition including: a $BaO$—$TiO_2$—$ReO_{3/2}$-based ceramic component represented by $xBaO$-$yTiO_2$-$zReO_{3/2}$ (in which the units of x, y, and z are each on a molar percent basis; $x+y+z=100$, $8 \leq x \leq 18$, $52.5 \leq y \leq 65$, and $20 \leq z \leq 40$ hold; and Re is at least one of rare earth elements) as disclosed in Japanese Unexamined Patent Application Publication No. 2002-97072; and a glass composition containing 10 to 25 percent by weight of $SiO_2$, 10 to 40 percent by weight of $B_2O_3$, 25 to 55 percent by weight of MgO, 0 to 20 percent by weight of ZnO, 0 to 15 percent by weight of $Al_2O_3$, 0.5 to 10 percent by weight of $Li_2O$, and 0 to 10 percent by weight of RO (in which, R is at least one of Ba, Sr, and Ca).

(3) A high dielectric ceramic composition being a mixture including: a $BaO$—$TiO_2$—$ReO_{3/2}$—$BiO_3$-based ceramic powder (in which Re is a rare earth element) as disclosed in Japanese Unexamined Patent Application Publication No. 11-310455; and a glass powder containing 13 to 50 percent by weight of $SiO_2$, 3 to 30 percent by weight of $B_2O_3$, 40 to 80 percent by weight of an alkaline earth metal oxide, and 0.1 to 10 percent by weight of $Li_2O$.

(4) A high dielectric ceramic composition being a mixture including: a $BaO$—$TiO_2$—$ReO_{3/2}$-based ceramic powder (in which Re is a rare earth element) as disclosed in Japanese Unexamined Patent Application Publication No. 11-228222; and a glass powder containing 13 to 50 percent by weight of $SiO_2$, 3 to 30 percent by weight of $B_2O_3$, 40 to 80 percent by weight of an alkaline earth metal oxide, and 0.5 to 10 percent by weight of $Li_2O$.

In addition, the above high dielectric ceramic composition (1) preferably further includes $Li_2O$.

Next, an organic vehicle composed of a binder resin and a solvent is added to one of the above high dielectric ceramic compositions (1) to (4), so that a ceramic slurry is obtained. After this ceramic slurry is formed into sheets by a doctor blade method, followed by drying, the ceramic green sheets are obtained by punching so as to have a predetermined dimension. In order to form the wiring conductors on the ceramic green sheets, a conductive paste containing copper or silver as a primary component is applied thereto to form desired patterns.

Next, a predetermined number of the glass ceramic green sheets and a predetermined number of the high dielectric ceramic green sheets obtained as described above are laminated in a predetermined order and are then pressurized in the thickness direction.

Subsequently, a green laminate obtained as described above is fired at 1,000° C. or less, such as 800 to 1,000° C., so that the multilayer ceramic substrate 2 can be obtained. In this step, the firing is performed in a non-oxidizing atmosphere, for example, in a nitrogen atmosphere, when the wiring conductors contain copper as a primary component, and the firing is performed in an oxidizing atmosphere, for example, in the air, when silver is used as a primary component.

Next, the electronic devices 9 to 17 are mounted on the surface of the multilayer ceramic substrate 2 by soldering or the like, and the conductive cap 18 is then fitted, so that the ceramic multilayer module 1 is completed.

According to the ceramic multilayer module 1 described above, since the glass ceramic layers 3 forming the multilayer ceramic substrate 2 are formed using the glass ceramic composition of the present invention, and in addition, wiring conductors 6 to 8 are formed using a metal, such as copper or silver, having a relatively low specific resistance as a primary component, the relative dielectric constant of the glass ceramic layer 3 is low, the temperature characteristics of resonant frequency are superior, and the Q value is also high; hence, a reliable ceramic multilayer module 1 suitably used for high frequency applications can be obtained. In addition, the insulating reliability of the ceramic multilayer module 1 can be made superior. Furthermore, the flexural strength of the multilayer ceramic substrate 2 of the multilayer ceramic module 1 can be increased.

Figure 4:
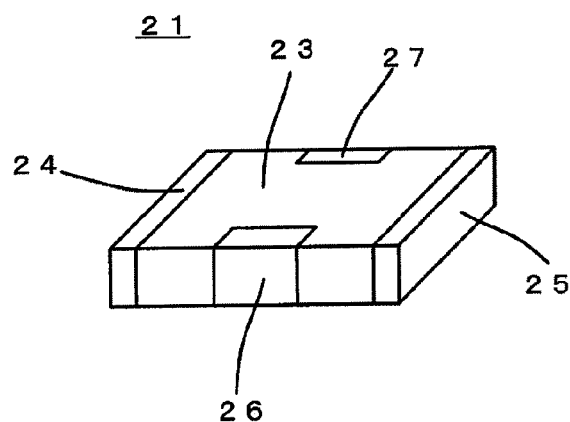
FIG. 4 is a perspective view showing the appearance of an LC filter 21 as another example of a multilayer ceramic electronic device which is formed by using the glass ceramic composition of the present invention.
Figure 5:
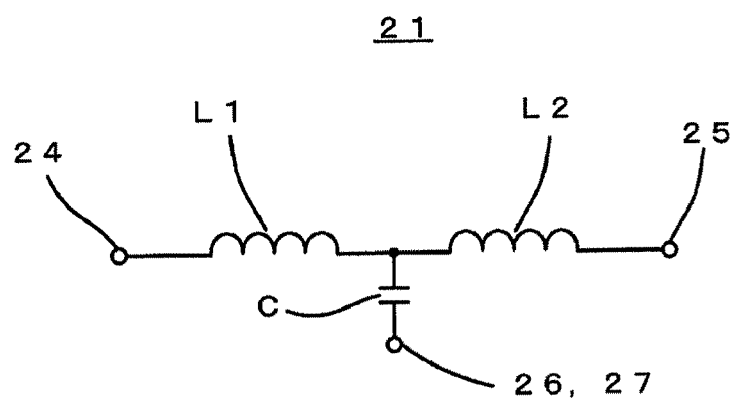
FIG. 5 is an equivalent circuit diagram of the LC filter 21 shown in FIG. 4.
Figure 6:
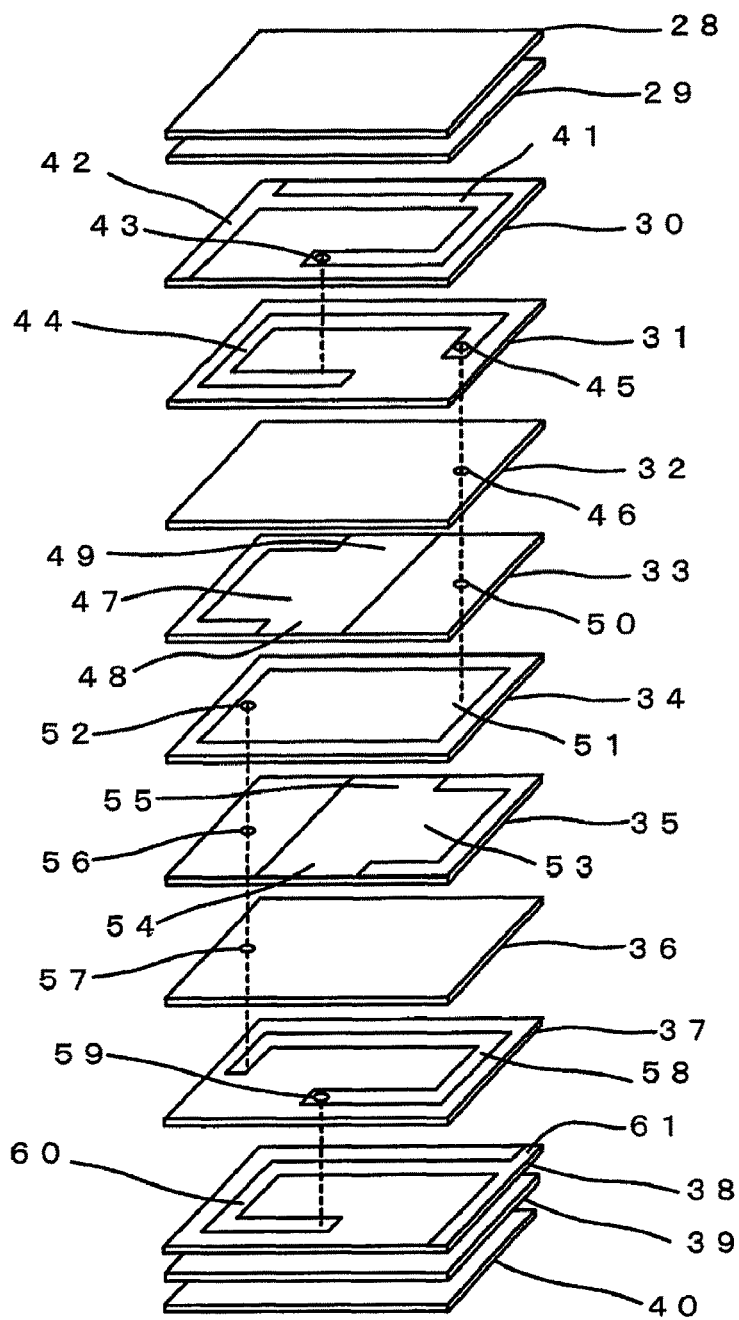
FIG. 6 is an exploded perspective view showing a green laminate 22 as an interim product to be processed by a firing step performed to manufacture the LC filter 21 shown in FIG. 4.

FIGS. 4 to 6 are views illustrating an LC filter 21 as another example of the multilayer ceramic electronic device formed by using the glass ceramic composition of the present invention. In this case, FIG. 4 is a perspective view showing the appearance of the LC filter 21, FIG. 5 is an equivalent circuit diagram of the LC filter 21, and FIG. 6 is an exploded perspective view showing a green laminate 22 as an interim product to be processed by a firing step of manufacturing the LC filter.

The LC filter 21 has a component main body 23 as a laminate structure formed of glass ceramic layers laminated to each other, terminal electrodes 24 and 25 are provided on respective end portions of outer surfaces of this component main body 23, and terminal electrodes 26 and 27 are provided on intermediate portions of respective side surfaces.

As shown in FIG. 5, the LC filter 21 forms two inductances L1 and L2 connected in series between the terminal electrodes 24 and 25 and forms a capacitance C between a connection point of the inductances L1 and L2 and the terminal electrodes 26 and 27.

With reference to FIG. 6, the green laminate 22 is a laminate to be formed into the component main body 23 by firing and has a plurality of ceramic green sheets 28 to 40 laminated to each other. In addition, the number of ceramic green sheets to be laminated is not limited to that shown in the figure.

The ceramic green sheets 28 to 40 are each obtained by the steps of forming a ceramic slurry obtained by adding and mixing an organic vehicle composed of a binder resin and a solvent to and with the glass ceramic composition of the present invention into sheets by a doctor blade method, subsequently performing drying, and then punching out the sheets to have a predetermined dimension.

In addition, as shown in FIG. 5, in order to form the inductances L1 and L2 and the capacitance C shown in FIG. 5, wiring conductors are provided for specific ceramic green sheets 28 to 40 in a manner as described below.

A coil pattern 41 forming part of the inductance L1 is formed on the ceramic green sheet 30, a lead pattern 42 extending from one end of the coil pattern 41 is also formed thereon, and a via hole conductor 43 is provided in the other end of the coil pattern 41.

A coil pattern 44 forming part of the inductance L1 is formed on the ceramic green sheet 31, and in one end of the coil pattern 44, a via hole conductor 45 is provided. The other end of the coil pattern 44 is connected to the via hole conductor 43 described above.

A via hole conductor 46 connected to the above via hole conductor 45 is provided in the ceramic green sheet 32.

On the ceramic green sheet 33, a capacitor pattern 47 forming part of the capacitance C is formed, and in addition, lead patterns 48 and 49 extending from the capacitor pattern 47 are formed. In addition, a via hole conductor 50 connected to the via hole conductor 46 described above is provided in the ceramic green sheet 33.

A capacitor pattern 51 forming part of the capacitance C is formed on the ceramic green sheet 34, and in addition, a via hole conductor 52 connected to the capacitor pattern 51 is provided therein. The capacitor pattern 51 is connected to the via hole conductor 50 described above.

On the ceramic green sheet 35, a capacitor pattern 53 forming part of the capacitance C is formed, and in addition, lead patterns 54 and 55 extending from this capacitor pattern 53 are also formed. In addition, in this ceramic green sheet 35, a via hole conductor 56 connected to the via hole conductor 52 described above is provided.

In the ceramic green sheet 36, a via hole conductor 57 connected to the above via hole conductor 56 is provided.

On the ceramic green sheet 37, a coil pattern 58 forming part of the inductance L2 is formed, and in one end thereof, a via hole conductor 59 is provided. The other end of the coil pattern 58 is connected to the via hole conductor 57 described above.

On the ceramic green sheet 38, a coil pattern 60 forming part of the inductance L2 is formed, and in addition, a lead pattern 61 extending from one end of this coil pattern 60 is also formed. The other end of the coil pattern 60 is connected to the via hole conductor 59 described above.

When the coil patterns 41, 44, 58, and 60, the lead patterns 42, 48, 49, 54, 55, and 61, the via hole conductors 43, 45, 46, 50, 52, 56, 57, and 59, and the capacitor patterns 47, 51, and 53, which function as the wiring conductors, are formed, a conductive paste containing copper or silver as a primary component is used, and this conductive paste is applied, for example, by screen printing.

In order to obtain the green laminate 22, the ceramic green sheets 28 to 40 are laminated in the order shown in FIG. 6 and are then pressurized in the thickness direction.

Subsequently, by firing the green laminate 22 at a temperature of 1,000° C. or less, such as 800 to 1,000° C., the component main body 23 shown in FIG. 4 can be obtained. In this step, as in the case of the ceramic multilayer module 1 described above, when the wiring conductor contains copper as a primary component, the firing is performed in a non-oxidizing atmosphere, for example, in a nitrogen atmosphere, and when silver is used as a primary component, the firing is performed in an oxidizing atmosphere, for example, in the air.

Next, the terminal electrodes 24 to 27 are formed on the outer surfaces of the component main body 23. In order to form the terminal electrodes 24 to 27, for example, application and firing of a conductive paste containing copper or silver as a primary component, or a thin film forming method, such as deposition, plating, or sputtering may be used.

As described above, the LC filter 21 can be obtained. According to this LC filter 21, since the ceramic green sheets 28 to 40 are each formed by using the glass ceramic composition of the present invention, in the component main body 23, the relative dielectric constant is low, the frequency characteristics are superior, the electrical insulating reliability can be further improved, and a high flexural strength can be obtained.

In the above description, the ceramic green sheets 28 to 40 are each formed by using the glass ceramic composition of the present invention, and the ceramic green sheets 33 and 34, which are directly responsible for forming the capacitance C, among the ceramic green sheets 28 to 40 are preferably formed by using a high dielectric ceramic composition of a high dielectric constant material forming the high dielectric ceramic layers 4 of the ceramic multilayer module 1 shown in FIG. 1.

The multilayer ceramic electronic device formed by using the glass ceramic composition of the present invention is not limited to the ceramic multilayer module 1 and the LC filter 21 as shown in the figures. For example, the glass ceramic composition of the present invention may also be applied to various multilayer ceramic substrates, such as a multilayer ceramic substrate for multichip modules and a multilayer ceramic substrate for hybrid ICs; or various composite electronic devices in which electronic devices are mounted on the multilayer ceramic substrates described above. In addition, the glass ceramic composition of the present invention may be further applied to various chip type multilayer ceramic electronic devices, such as a chip type multilayer capacitor and a chip type multilayer dielectric antenna.

Next, experimental examples will be described which were carried out in order to confirm the properties obtained by the glass ceramic composition of the present invention and in order to obtain the range of the glass ceramic composition of the present invention.

Experimental Example 1

First, as a borosilicate glass powder contained in a glass ceramic composition, various compositions shown in Table 1 were prepared.

TABLE 1

| GLASS MARK | Li$_2$O [PERCENT BY WEIGHT] | MgO [PERCENT BY WEIGHT] | BaO [PERCENT BY WEIGHT] | CaO [PERCENT BY WEIGHT] | SrO [PERCENT BY WEIGHT] | B$_2$O$_3$ [PERCENT BY WEIGHT] | SiO$_2$ [PERCENT BY WEIGHT] | ZnO [PERCENT BY WEIGHT] | REMARK |
|---|---|---|---|---|---|---|---|---|---|
| G1* | 2 | 28 | 2.5 | 0 | 15 | 20 | 25 | 7.5 | |
| G2 | 3 | 27 | 2.5 | 0 | 15 | 20 | 25 | 7.5 | |
| G3 | 15 | 22.5 | 2.5 | 0 | 10 | 17.5 | 25 | 7.5 | |
| G4* | 16 | 21.5 | 2.5 | 0 | 10 | 17.5 | 25 | 7.5 | |
| G5* | 5 | 17.5 | 0 | 0 | 20 | 25 | 25 | 7.5 | |
| G6 | 5 | 20 | 0 | 0 | 17.5 | 25 | 25 | 7.5 | |
| G7* | 5 | 50 | 0 | 0 | 5 | 17.5 | 15 | 7.5 | |
| G8 | 5 | 50 | 5 | 0 | 0 | 17.5 | 15 | 7.5 | |
| G9 | 5 | 50 | 0 | 5 | 0 | 17.5 | 15 | 7.5 | |
| G10 | 5 | 50 | 1 | 2 | 2 | 17.5 | 15 | 7.5 | |
| G11* | 5 | 52.5 | 0 | 0 | 2.5 | 17.5 | 15 | 7.5 | DEVITRIFICATION |
| G12* | 5 | 31 | 2.5 | 0 | 15 | 14 | 25 | 7.5 | DEVITRIFICATION |
| G13 | 5 | 30 | 2.5 | 0 | 15 | 15 | 25 | 7.5 | |
| G14 | 5 | 25 | 2.5 | 0 | 10 | 30 | 20 | 7.5 | |
| G15* | 5 | 24 | 2.5 | 0 | 10 | 31 | 20 | 7.5 | |
| G16* | 5 | 41 | 2.5 | 0 | 15 | 20 | 9 | 7.5 | DEVITRIFICATION |
| G17 | 5 | 40 | 2.5 | 0 | 15 | 20 | 10 | 7.5 | |
| G18 | 5 | 22.5 | 2.5 | 0 | 10 | 17.5 | 35 | 7.5 | |
| G19* | 5 | 21.5 | 2.5 | 0 | 10 | 17.5 | 36 | 7.5 | |
| G20* | 5 | 27.5 | 2.5 | 0 | 15 | 20 | 25 | 5 | |
| G21 | 5 | 26.5 | 2.5 | 0 | 15 | 20 | 25 | 6 | |
| G22 | 5 | 25 | 2.5 | 0 | 5 | 17.5 | 25 | 20 | |
| G23* | 5 | 24 | 2.5 | 0 | 5 | 17.5 | 25 | 21 | |
| G24* | 5 | 21.5 | 26 | 0 | 0 | 20 | 20 | 7.5 | |
| G25 | 5 | 17.5 | 25 | 0 | 0 | 20 | 25 | 7.5 | |
| G26 | 5 | 30 | 2.5 | 0 | 15 | 20 | 20 | 7.5 | |
| G27* | 5 | 26.5 | 0 | 16 | 0 | 20 | 25 | 7.5 | |
| G28 | 5 | 27.5 | 0 | 15 | 0 | 20 | 25 | 7.5 | |
| G29 | 5 | 25 | 0 | 2.5 | 15 | 20 | 25 | 7.5 | |
| G30* | 5 | 21.5 | 0 | 0 | 26 | 20 | 20 | 7.5 | |
| G31 | 5 | 17.5 | 0 | 0 | 25 | 20 | 25 | 7.5 | |
| G32 | 5 | 25 | 10 | 5 | 2.5 | 20 | 25 | 7.5 | |
| G33 | 5 | 27.5 | 0 | 0 | 15 | 20 | 25 | 7.5 | |

In Table 1, "Glass Mark" provided with * indicates a glass powder having a composition out of the range of the present invention.

The glass powders shown in Table 1, except for Glasses G11, G12, and G16 in which devitrification occurred, were pulverized until an average particle diameter of 1 to 2 μm was obtained, so that borosilicate glass powders for the glass ceramic compositions were prepared.

As a first ceramic powder included in the glass ceramic composition, a Mg$_2$SiO$_4$ powder having an average particle diameter (medium diameter D50) of 0.8 μm was prepared. As a second ceramic powder, a SrTiO$_3$ powder having an average particle diameter of 1.5 μm and a TiO$_2$ powder having an average particle diameter of 1.0 μm were each prepared. As a third ceramic powder, a BaZrO$_3$ powder having an average particle diameter of 0.8 μm was prepared, and as a fourth ceramic powder, a SrZrO$_3$ powder having an average particle diameter of 0.5 μm was prepared.

Next, in order to obtain a glass ceramic composition of each sample shown in Table 2, the above-described first ceramic powder, borosilicate glass powder, second ceramic powder, third ceramic powder, and fourth ceramic powder were mixed together.

TABLE 2

| SAMPLE NO. | AMOUNT OF FIRST CERAMIC (Mg$_2$SiO$_4$) (PERCENT BY WEIGHT) | GLASS TYPE | GLASS AMOUNT (PERCENT BY WEIGHT) | SECOND CERAMIC SrTiO$_3$ AMOUNT (PERCENT BY WEIGHT) | SECOND CERAMIC TiO$_2$ AMOUNT (PERCENT BY WEIGHT) | AMOUNT OF THIRD CERAMIC (BaZrO$_3$) (PERCENT BY WEIGHT) | AMOUNT OF FOURTH CERAMIC (SrZrO$_3$) (PERCENT BY WEIGHT) |
|---|---|---|---|---|---|---|---|
| 1* | 59.0 | G1 | 20.0 | 5.0 | 1.0 | 10.0 | 5.0 |
| 2 | 59.0 | G2 | 20.0 | 5.0 | 1.0 | 10.0 | 5.0 |
| 3 | 76.0 | G3 | 3.0 | 5.0 | 1.0 | 10.0 | 5.0 |
| 4* | 76.0 | G4 | 3.0 | 5.0 | 1.0 | 10.0 | 5.0 |
| 5* | 69.0 | G5 | 10.0 | 5.0 | 1.0 | 10.0 | 5.0 |
| 6 | 69.0 | G6 | 10.0 | 5.0 | 1.0 | 10.0 | 5.0 |
| 7 | 69.0 | G7 | 10.0 | 5.0 | 1.0 | 10.0 | 5.0 |
| 8 | 69.0 | G8 | 10.0 | 5.0 | 1.0 | 10.0 | 5.0 |
| 9 | 69.0 | G9 | 10.0 | 5.0 | 1.0 | 10.0 | 5.0 |
| 10 | 69.0 | G10 | 10.0 | 5.0 | 1.0 | 10.0 | 5.0 |
| 11 | 64.0 | G13 | 15.0 | 5.0 | 1.0 | 10.0 | 5.0 |
| 12 | 74.0 | G14 | 5.0 | 5.0 | 1.0 | 10.0 | 5.0 |

TABLE 2-continued

| SAMPLE NO. | AMOUNT OF FIRST CERAMIC (Mg$_2$SiO$_4$) (PERCENT BY WEIGHT) | GLASS TYPE | GLASS AMOUNT (PERCENT BY WEIGHT) | SECOND CERAMIC SrTiO$_3$ AMOUNT (PERCENT BY WEIGHT) | SECOND CERAMIC TiO$_2$ AMOUNT (PERCENT BY WEIGHT) | AMOUNT OF THIRD CERAMIC (BaZrO$_3$) (PERCENT BY WEIGHT) | AMOUNT OF FOURTH CERAMIC (SrZrO$_3$) (PERCENT BY WEIGHT) |
|---|---|---|---|---|---|---|---|
| 13* | 74.0 | G15 | 5.0 | 5.0 | 1.0 | 10.0 | 5.0 |
| 14 | 74.0 | G17 | 5.0 | 5.0 | 1.0 | 10.0 | 5.0 |
| 15 | 61.5 | G18 | 17.5 | 5.0 | 1.0 | 10.0 | 5.0 |
| 16* | 61.5 | G19 | 17.5 | 5.0 | 1.0 | 10.0 | 5.0 |
| 17* | 69.0 | G20 | 10.0 | 5.0 | 1.0 | 10.0 | 5.0 |
| 18 | 69.0 | G21 | 10.0 | 5.0 | 1.0 | 10.0 | 5.0 |
| 19 | 69.0 | G22 | 10.0 | 5.0 | 1.0 | 10.0 | 5.0 |
| 20* | 69.0 | G23 | 10.0 | 5.0 | 1.0 | 10.0 | 5.0 |
| 21* | 69.0 | G24 | 10.0 | 5.0 | 1.0 | 10.0 | 5.0 |
| 22 | 69.0 | G25 | 10.0 | 5.0 | 1.0 | 10.0 | 5.0 |
| 23 | 69.0 | G26 | 10.0 | 5.0 | 1.0 | 10.0 | 5.0 |
| 24* | 69.0 | G27 | 10.0 | 5.0 | 1.0 | 10.0 | 5.0 |
| 25 | 69.0 | G28 | 10.0 | 5.0 | 1.0 | 10.0 | 5.0 |
| 26 | 69.0 | G29 | 10.0 | 5.0 | 1.0 | 10.0 | 5.0 |
| 27* | 69.0 | G30 | 10.0 | 5.0 | 1.0 | 10.0 | 5.0 |
| 28 | 69.0 | G31 | 10.0 | 5.0 | 1.0 | 10.0 | 5.0 |
| 29 | 69.0 | G32 | 10.0 | 5.0 | 1.0 | 10.0 | 5.0 |
| 30* | 77.0 | G33 | 2.0 | 5.0 | 1.0 | 10.0 | 5.0 |
| 31 | 76.0 | G33 | 3.0 | 5.0 | 1.0 | 10.0 | 5.0 |
| 32 | 59.0 | G33 | 20.0 | 5.0 | 1.0 | 10.0 | 5.0 |
| 33* | 54.0 | G33 | 25.0 | 5.0 | 1.0 | 10.0 | 5.0 |
| 34 | 70.0 | G33 | 10.0 | 5.0 | 0.0 | 10.0 | 5.0 |
| 35 | 69.7 | G33 | 10.0 | 5.0 | 0.3 | 10.0 | 5.0 |
| 36 | 60.0 | G33 | 10.0 | 5.0 | 10.0 | 10.0 | 5.0 |
| 37* | 57.0 | G33 | 10.0 | 5.0 | 13.0 | 10.0 | 5.0 |
| 38 | 74.0 | G33 | 10.0 | 0.0 | 1.0 | 10.0 | 5.0 |
| 39 | 71.0 | G33 | 10.0 | 0.3 | 1.0 | 10.0 | 5.0 |
| 40 | 61.0 | G33 | 10.0 | 13.0 | 1.0 | 10.0 | 5.0 |
| 41* | 59.0 | G33 | 10.0 | 15.0 | 1.0 | 10.0 | 5.0 |
| 42* | 79.0 | G33 | 10.0 | 5.0 | 1.0 | 0.0 | 5.0 |
| 43 | 77.0 | G33 | 10.0 | 5.0 | 1.0 | 2.0 | 5.0 |
| 44 | 69.0 | G33 | 10.0 | 5.0 | 1.0 | 10.0 | 5.0 |
| 45 | 59.0 | G33 | 10.0 | 5.0 | 1.0 | 20.0 | 5.0 |
| 46* | 54.0 | G33 | 10.0 | 5.0 | 1.0 | 25.0 | 5.0 |
| 47* | 74.0 | G33 | 10.0 | 5.0 | 1.0 | 10.0 | 0.0 |
| 48* | 72.0 | G33 | 10.0 | 5.0 | 1.0 | 10.0 | 2.0 |
| 49 | 71.5 | G33 | 10.0 | 5.0 | 1.0 | 10.0 | 2.5 |
| 50 | 71.0 | G33 | 10.0 | 5.0 | 1.0 | 10.0 | 3.0 |
| 51 | 64.0 | G33 | 10.0 | 5.0 | 1.0 | 10.0 | 10.0 |
| 52 | 54.0 | G33 | 10.0 | 5.0 | 1.0 | 10.0 | 20.0 |
| 53* | 49.0 | G33 | 10.0 | 5.0 | 1.0 | 10.0 | 25.0 |
| 54* | 75.0 | G33 | 10.0 | 0.0 | 0.0 | 10.0 | 5.0 |

In Table 2, Sample Nos. provided with * indicates a glass ceramic composition out of the range of the present invention.

In Table 2, in the column "Type" of "Borosilicate Glass", the "Glass Mark" in Table 1 is shown, and in the column "Amount" in the same group as described above, the addition amount of the borosilicate glass powder is shown.

In the column "Second Ceramic", the addition amounts of SrTiO$_3$ and TiO$_2$, which are the second ceramic powders, are shown.

Next, as shown in Table 3, the relative dielectric constant ($\in_r$), Qf value, temperature coefficient ($\tau_f$) of resonant frequency, insulating reliability, rate of change in capacitance, and flexural strength of each sample were evaluated.

For measurement of the $\in_r$ and the Qf value, a pressure-bonded body having a dimension of 0.6 mm×50 mm×50 mm was formed by the steps of adding 20 parts by weight of an acrylic resin as a binder and 3 parts by weight of methyl ethyl ketone as an organic solvent to 100 parts by weight of the glass ceramic composition of each sample shown in Table 2 to form a slurry, this slurry was formed into sheets by a doctor blade method, the sheets were laminated to each other, and then pressure bonding thereof was performed. Next, this pressure-bonded body was fired at a temperature of 1,000° C. or less, so that a ceramic substrate was obtained. Subsequently, the $\in_r$ and the Qf value of this ceramic substrate were measured by a resonance cavity method. In this measurement, the measurement frequency was set to approximately 25 GHz.

For measurement of the $\tau_f$, after 20 parts by weight of an acrylic resin as a binder and 3 parts by weight of methyl ethyl ketone as an organic solvent were added to 100 parts by weight of the glass ceramic composition of each sample shown in Table 2 and were then pelletized, the pellets were formed into a cylindrical shape having a thickness of 8 mm and a diameter of 15 mm by press molding. After the cylindrical sample was fired at a temperature of 1,000° C. or less, the $\tau_f$ was measured by a dielectric resonator method.

For evaluation of the insulating reliability and the rate of change in capacitance, a multilayer ceramic capacitor used as the sample was formed by the steps of adding 20 parts by weight of an acrylic resin as a binder and 3 parts by weight of methyl ethyl ketone as an organic solvent to 100 parts by weight of the glass ceramic composition of each sample shown in Table 2 to form a slurry, the slurry was formed into sheets by a doctor blade method, and a Cu conductive paste printed on the sheets to form internal electrodes, followed by lamination, pressure bonding, and firing. The distance between the internal electrodes of this multilayer ceramic capacitor was set to 13 μm. Next, samples of this multilayer ceramic capacitor were subjected to a loading test for 100 hours under conditions at a temperature of 121° C., a relative humidity of 100%, 0.2 MPa, and a DC voltage application of 200 volts.

After the loading test, the insulating resistance was measured, and when the insulating resistance was 11 or more in terms of log IR, the insulating reliability was regarded as good and was represented by "○" in Table 3. When the insulating resistance was less than 11 in terms of log IR, the insulating reliability was regarded as not good and was represented by "x" in Table 3.

As for the rate of change in capacitance, a loading test was performed on the multilayer ceramic capacitor formed for evaluation of the above insulating reliability under the same conditions as described above, and the capacitances before and after the test were measured by an LCR meter. When the capacitance before the test is represented by $C_0$ and the capacitance after the test is represented by $C_1$, the rate of change in capacitance is obtained by the following equation:

rate of change in capacitance(%)=${(C_1-C_0)/C_0}\times 100$

For measurement of the flexural strength, a pressure-bonded body having a dimension of 0.8 mm×40 mm×6 mm was formed by the steps of adding 20 parts by weight of an acrylic resin as a binder and 3 parts by weight of methyl ethyl ketone as an organic solvent to 100 parts by weight of the glass ceramic composition of each sample shown in Table 2 to form a slurry, forming the slurry into sheets by a doctor blade method, laminating the sheets thus formed to each other, and then performing pressure bonding thereof. This pressure-bonded body was fired at a temperature of 1,000° C. or less, so that a ceramic substrate was obtained. Subsequently, a three-point flexural test was performed on this ceramic substrate, so that the flexural strength was measured.

TABLE 3

| SAMPLE NO. | $\epsilon_r$ | Qf [GHz] | $\tau_f$ [ppm·°C.$^{-1}$] | INSULATING RELIABILITY | RATE OF CHANGE IN CAPACITANCE [%] | FLEXURAL STRENGTH [MPa] |
|---|---|---|---|---|---|---|
| 1* | NON-SINTERED | — | — | — | — | — |
| 2 | 8.7 | 12000 | 8.3 | ○ | 0.26 | 312 |
| 3 | 8.8 | 10000 | −5.8 | ○ | 0.15 | 331 |
| 4* | 8.8 | 6000 | −5.8 | X | 1.20 | 330 |
| 5* | 9.2 | 9000 | 1.2 | ○ | 0.16 | 318 |
| 6 | 9.2 | 15000 | 1.6 | ○ | 0.16 | 316 |
| 7 | 8.8 | 23000 | 3.1 | ○ | 0.05 | 312 |
| 8 | 8.9 | 21000 | 2.8 | ○ | 0.03 | 310 |
| 9 | 8.8 | 22000 | 2.9 | ○ | 0.05 | 312 |
| 10 | 8.8 | 22000 | 3 | ○ | 0.04 | 315 |
| 11 | 8.7 | 20000 | 4.2 | ○ | 0.20 | 308 |
| 12 | 8.8 | 10000 | −4.5 | ○ | 0.24 | 328 |
| 13* | 8.8 | 7000 | −4.8 | X | 0.40 | 330 |
| 14 | 8.8 | 15000 | −4.1 | ○ | 0.28 | 319 |
| 15 | 8.7 | 12000 | 6.3 | ○ | 0.30 | 302 |
| 16* | NON-SINTERED | — | — | — | — | — |
| 17* | 8.8 | 8000 | 0.6 | ○ | 0.03 | 317 |
| 18 | 8.8 | 13000 | 0.3 | ○ | 0.01 | 320 |
| 19 | 8.6 | 11000 | 2.5 | ○ | 0.25 | 316 |
| 20* | 8.6 | 8000 | 1.8 | X | 0.35 | 317 |
| 21* | NON-SINTERED | — | — | — | — | — |
| 22 | 8.9 | 20000 | 12.5 | ○ | 0.06 | 321 |
| 23 | 8.8 | 22000 | 8.6 | ○ | 0.04 | 314 |
| 24* | 8.8 | 8000 | 10.4 | ○ | 0.16 | 316 |
| 25 | 8.8 | 12000 | 7.8 | ○ | 0.12 | 321 |
| 26 | 8.8 | 24000 | 5.4 | ○ | 0.02 | 317 |
| 27* | 8.7 | 9000 | 9.4 | ○ | 0.09 | 320 |
| 28 | 8.7 | 15000 | 8.2 | ○ | 0.07 | 325 |
| 29 | 8.9 | 26000 | 3.1 | ○ | 0.02 | 320 |
| 30* | NON-SINTERED | — | — | — | — | — |
| 31 | 8.9 | 32000 | −5.8 | ○ | 0.02 | 331 |
| 32 | 8.7 | 11000 | 8.3 | ○ | 0.30 | 302 |
| 33* | 8.7 | 6000 | 12.4 | ○ | 0.60 | 220 |
| 34 | 8.6 | 33000 | −4 | ○ | −0.02 | 310 |
| 35 | 8.7 | 32000 | −3 | ○ | −0.01 | 322 |
| 36 | 9.8 | 12000 | 26 | ○ | 0.25 | 328 |
| 37* | 11.6 | 8000 | 46.2 | ○ | 0.48 | 280 |
| 38 | 8.8 | 32000 | −27 | ○ | 0.00 | 319 |
| 39 | 8.8 | 30000 | −10.3 | ○ | 0.00 | 315 |
| 40 | 8.7 | 18000 | 29 | ○ | 0.30 | 322 |
| 41* | 8.7 | 18000 | 35 | ○ | 0.60 | 320 |
| 42* | 8.1 | 36000 | 0 | ○ | 0.60 | 330 |
| 43 | 8.1 | 34000 | 0 | ○ | 0.30 | 325 |
| 44 | 8.8 | 30000 | 0.1 | ○ | 0.00 | 318 |
| 45 | 9.7 | 20000 | 0.2 | ○ | −0.20 | 304 |
| 46* | 10.2 | 20000 | 0.2 | ○ | −0.40 | 301 |
| 47* | 8.4 | 34000 | −1.3 | ○ | 0.02 | 177 |
| 48* | 8.4 | 32000 | −0.7 | ○ | 0.02 | 198 |
| 49 | 8.5 | 31000 | −0.4 | ○ | 0.01 | 300 |
| 50 | 8.8 | 30000 | 0.1 | ○ | 0.00 | 320 |
| 51 | 9.2 | 25000 | 1.5 | ○ | −0.03 | 346 |
| 52 | 9.8 | 20000 | 4.5 | ○ | −0.10 | 322 |

TABLE 3-continued

| SAMPLE NO. | $\epsilon_r$ | Qf [GHz] | $\tau_f$ [ppm·°C.$^{-1}$] | INSULATING RELIABILITY | RATE OF CHANGE IN CAPACITANCE [%] | FLEXURAL STRENGTH [MPa] |
|---|---|---|---|---|---|---|
| 53* | 10.1 | 18000 | 6 | ◯ | −0.15 | 310 |
| 54* | 8.8 | 33000 | −34 | ◯ | 0.01 | 318 |

In Table 3, Sample Nos. out of the range of the present invention are also provided with an*.

As can be seen, the samples within the range of the present invention shown in Tables 2 and 3 include the borosilicate glass powder within the range of the present invention shown in Table 1. Furthermore, as can be seen from Table 2, the samples within the range of the present invention each contain predetermined amounts of a $Mg_2SiO_4$ powder as the first ceramic powder, at least one powder of $SrTiO_3$ and $TiO_2$ as the second ceramic powder, a $BaZrO_3$ powder as the third ceramic powder, and a $SrZrO_3$ powder as the fourth ceramic powder. As a result, firing could be performed at a temperature of 1,000° C. or less, the insulating reliability was superior, the change in capacitance was small, a high Qf value was shown, a stable $\tau_f$ was shown, and a high flexural strength was shown.

On the other hand, Sample 1 in Tables 2 and 3 using the above glass was not sintered at a temperature of 1,000° C. or less since the content of $Li_2O$ of Glass G1 shown in Table 1 was less than 3 percent by weight. Since the content of $Li_2O$ of Glass G4 was more than 15 percent by weight, according to Sample 4 using such a glass, the Qf value decreased, and the insulating reliability was also degraded.

Since the content of MgO of Glass G5 was less than 20 percent by weight, the Qf value decreased according to Sample using this glass. On the other hand, the content of MgO of Glass 11 was more than 50 percent by weight and the phenomenon in which the glass is partly crystallized, that is, devitrification, occurred.

The content of $B_2O_3$ of Glass 12 was less than 15 percent by weight, and devitrification occurred. On the other hand, since the content of $B_2O_3$ of Glass 15 was more than 30 percent by weight, the Qf value decreased, and the insulating reliability was also degraded according to Sample 13 using this glass.

The content of $SiO_2$ of Glass 16 was less than 10 percent by weight, and devitrification occurred. On the other hand, the content of $SiO_2$ of Glass 19 was more than 35 percent by weight, and Sample 16 using this glass was not sintered at a temperature of 1,000° C. or less.

Since the content of ZnO of Glass 20 was less than 6 percent by weight, the Qf value was low according to Sample 17 using this glass. On the other hand, since the content of ZnO of Glass 23 was more than 20 percent by weight, the Qf value was low, and the insulating reliability was also degraded according to Sample 20 using this glass.

Since the content of BaO of Glass 24 was more than 25 percent by weight, sintering could not be performed at a temperature of 1,000° C. or less according to Sample 21 using this glass.

Since the content of CaO of Glass 27 was more than 15 percent by weight, and according to Sample 24 using this glass, the Qf value was low.

Since the content of SrO of Glass 30 was more than 25 percent by weight, the Qf value decreased according to Sample 27 which used this glass.

Without regard to the composition of the borosilicate glass powder, the content of the borosilicate glass powder was less that 3 percent by weight in Sample 30 as shown in Table 2, and sintering could not be performed at a temperature of 1,000° C. or less as shown in Table 3. On the other hand, according to Sample 33, the Qf value was low since the content of the borosilicate glass powder was more than 20 percent by weight.

In Sample 37, the content of $TiO_2$ as the second ceramic powder was more than 10 percent by weight, and the relative dielectric constant ($\epsilon_r$) was high, the Qf value was low, the temperature coefficient ($\tau_f$) of resonant frequency was large, and the change in capacitance was large.

According to Sample 41, when the content of $SrTiO_3$ as the second ceramic powder was more than 13 percent by weight, the temperature coefficient ($\tau_f$) of resonant frequency was large, and the change in capacitance was also large.

In Sample 54, the temperature coefficient ($\tau_f$) of resonant frequency was large since both $TiO_2$ and $SrTiO_3$ as the second ceramic powder were not added.

Since the content of $BaZrO_3$ as the third ceramic powder in Sample 42 was less than 2 percent by weight since $BaZrO_3$ was not added, and the change in capacitance was large. In Sample 46, the content of $BaZrO_3$ was more than 20 percent by weight, and the relative dielectric constant ($\epsilon_r$) was high, and the change in capacitance was large.

In Sample 47, $SrZrO_3$ as the fourth ceramic powder was not added, and the flexural strength was low. In Sample 48, where $SrZrO_3$ was added so that the content thereof was not more than 2 percent by weight, the flexural strength was low. According to Sample 53, where the content of $SrZrO_3$ was more than 20 percent by weight, the relative dielectric constant ($\epsilon_r$) was high.

Experimental Example 2

Experimental Example 2 was carried out in order to confirm the superiority of $SrZrO_3$ forming the fourth ceramic powder. More particularly, Sample 44 formed in Experimental Example 1 was used as a sample within the range of the present invention, and by using this sample as the reference, the superiority of $SrZrO_3$ was confirmed. Hence, as the fourth ceramic powder, besides a $SrZrO_3$ powder having an average particle diameter of 0.5 μm, an $Al_2O_3$ powder having an average particle diameter of 0.5 μm was also prepared.

Next, in order to obtain a glass ceramic composition of each sample in accordance with Table 4 by using Glass G33 shown in the Table 1, the first ceramic powder, the borosilicate glass powder, the second ceramic powder, the third ceramic powder, and the fourth ceramic powder were mixed together.

TABLE 4

| SAMPLE NO. | AMOUNT OF FIRST CERAMIC (Mg$_2$SiO$_4$) (PERCENT BY WEIGHT) | GLASS TYPE | GLASS AMOUNT (PERCENT BY WEIGHT) | SECOND CERAMIC SrTiO$_3$ AMOUNT (PERCENT BY WEIGHT) | SECOND CERAMIC TiO$_2$ AMOUNT (PERCENT BY WEIGHT) | AMOUNT OF THIRD CERAMIC (BaZrO$_3$) (PERCENT BY WEIGHT) | FOURTH CERAMIC TYPE (PERCENT BY WEIGHT) | FOURTH CERAMIC AMOUNT (PERCENT BY WEIGHT) |
|---|---|---|---|---|---|---|---|---|
| 44 | 69.0 | G33 | 10.0 | 5.0 | 1.0 | 10.0 | SrZrO$_3$ | 5.0 |
| 61* | 69.0 | G33 | 10.0 | 5.0 | 1.0 | 10.0 | Al$_2$O$_3$ | 5.0 |
| 62* | 64.0 | G33 | 10.0 | 5.0 | 1.0 | 10.0 | Al$_2$O$_3$ | 10.0 |

In Tables 4 and 5, Sample 44 shown in Tables 2 and 3 is used as the reference. In addition, Samples 61 and 62 provided with * used the Al$_2$O$_3$ powder as the fourth ceramic powder, and the glass ceramic compositions thereof were out of the range of the present invention.

Next, as in Experimental Example 1, the relative dielectric constant ($\epsilon_r$), the Qf value, the temperature coefficient ($\tau_f$) of resonant frequency, the insulating reliability, the rate of change in capacitance, and the flexural strength of the glass ceramic composition of each sample shown in Table 4 were evaluated. The results are shown in Table 5.

TABLE 5

| SAMPLE NO. | $\epsilon_r$ | Qf [GHz] | $\tau_f$ [ppm·°C.$^{-1}$] | INSULATING RELIABILITY | RATE OF CHANGE IN CAPACITANCE [%] | FLEXURAL STRENGTH [MPa] |
|---|---|---|---|---|---|---|
| 44 | 8.8 | 30000 | 0.1 | ○ | 0.00 | 318 |
| 61* | 8.3 | 23000 | -1.5 | X | 0.63 | 310 |
| 62* | 8.4 | 20000 | -2.1 | X | 1.22 | 315 |

As shown in Table 5, with Sample 44 which is within the range of the present invention and in which the SrZrO$_3$ powder was used as the fourth ceramic powder, firing could be performed at a temperature of 1,000° C. or less, the insulating reliability was superior, the change in capacitance was small (rate of change in capacitance: 0.3% or less), a high Qf value was shown (Qf≧10,000 GHz), a stable $\tau_f$ ($\tau_f$≦±30 ppm/° C.) was shown, and a high flexural strength was also shown.

On the other hand, although a relatively high flexural strength was shown in Samples 61 and 62 in which the Al$_2$O$_3$ powder was used as the fourth ceramic powder, the insulating reliability was inferior. The reason for this is believed that since most of Al$_2$O$_3$ reacts with the glass and dissolves therein, a glass having inferior reliability is formed.

In the case of SrZrO$_3$ as in Sample 44 described above, a solid solution (Ba,Sr)ZrO$_3$ is formed in corporation with BaZrO$_3$ contained as a filler and can be stably present in a ceramic. Hence, it is believed that while electrical properties substantially equivalent to those of a sample (such as Sample 47 in Experimental Example 1) in which SrZrO$_3$ is not added are maintained, the mechanical strength can be increased.

Experimental Example 3

When the multilayer ceramic substrate 2 of the ceramic multilayer module 1 shown in FIGS. 1 and 2 is manufactured, co-sintering properties between the glass ceramic layers 3 having a low dielectric constant formed by using the glass ceramic composition of the present invention and the high dielectric ceramic layers 4 formed by using a high dielectric ceramic composition become an important issue, and in Experimental Example 3, the co-sintering properties described above were investigated.

As a high dielectric ceramic composition for high dielectric ceramic layers, Glasses G101, G102, and G103 having compositions shown in Table 6 were prepared. In addition, ceramic powders shown in the column "Ceramic" in Table 7 were prepared.

TABLE 6

| GLASS MARK | SiO$_2$ [PERCENT BY WEIGHT] | B$_2$O$_3$ [PERCENT BY WEIGHT] | RO [PERCENT BY WEIGHT] MgO | RO [PERCENT BY WEIGHT] CaO | RO [PERCENT BY WEIGHT] SrO | RO [PERCENT BY WEIGHT] BaO | Li$_2$O [PERCENT BY WEIGHT] | ZnO [PERCENT BY WEIGHT] |
|---|---|---|---|---|---|---|---|---|
| G101 | 25.0 | 20.0 | 25.0 | 10.0 | 5.0 | 0 | 5.0 | 10.0 |
| G102 | 25.0 | 20.0 | 25.0 | 0 | 15.0 | 0 | 5.0 | 10.0 |
| G103 | 25.0 | 20.0 | 25.0 | 0 | 5.0 | 10.0 | 5.0 | 10.0 |

TABLE 7

| SAMPLE NO. | CERAMIC TYPE | CERAMIC AMOUNT (PERCENT BY WEIGHT) | GLASS TYPE | GLASS AMOUNT (PERCENT BY WEIGHT) |
|---|---|---|---|---|
| 101 | $CaZrO_3$ | 95.0 | G101 | 5.0 |
| 102 | $SrZrO_3$ | 95.0 | G102 | 5.0 |
| 103 | $BaZrO_3$ | 95.0 | G103 | 5.0 |
| 104 | $0.15BaO\text{—}0.60TiO_2\text{—}0.25NdO_{3/2}$ | 90.0 | G103 | 10.0 |
| 105 | $0.15BaO\text{—}0.60TiO_2\text{—}0.25SmO_{3/2}$ | 90.0 | G103 | 10.0 |
| 106 | $0.15BaO\text{—}0.60TiO_2\text{—}0.25LaO_{3/2}$ | 90.0 | G103 | 10.0 |

Next, in accordance with the composition and the mixing ratio shown in Table 7, the ceramic powder and the glass powder were mixed together, so that glass ceramic compositions (hereinafter each referred to as "second glass ceramic") having a high dielectric constant of Samples 101 to 106 were obtained.

Next, as shown in Table 8, the glass ceramic composition (hereinafter referred to as "first glass ceramic") of Sample 50 formed in Experimental Example 1 was used as a glass ceramic composition having a low dielectric constant of the present invention, and the second glass ceramic of each of Samples 101 to 106 was used in combination with the above glass ceramic composition, so that the co-sintering properties between the first glass ceramic and the second glass ceramic were evaluated.

More particularly, three glass ceramic layers each having a thickness of 50 μm and formed of the first glass ceramic were laminated on each of the top and the bottom surfaces of a laminate formed by laminating five glass ceramic layers each having a thickness of 50 μm and formed of the second glass ceramic, followed by pressure bonding, so that a composite laminate was formed. Subsequently, this composite laminate was fired, and two types of co-sintered bodies having a size of 10 mm square and a size of 100 mm square were obtained. Next, after a central cross-section of each sample was exposed by polishing and was then observed by a metallographic microscope, the defects (pores, cracks, and peeling) were evaluated. In Table 8, the generation of defects is shown by "x", and no generation of defects is shown by "○".

TABLE 8

| SAMPLE NO. | SAMPLE NO. OF FIRST GLASS CERAMIC | SAMPLE NO. OF SECOND GLASS CERAMIC | CO-SINTERING PROPERTIES 10 mm□ | CO-SINTERING PROPERTIES 10 mm□ |
|---|---|---|---|---|
| 201 | 50 | 101 | ○ | ○ |
| 202 | 50 | 102 | ○ | ○ |
| 203 | 50 | 103 | ○ | ○ |
| 204 | 50 | 104 | ○ | X |
| 205 | 50 | 105 | ○ | X |
| 206 | 50 | 106 | ○ | X |

As can be seen from Table 8, for co-sintered bodies having a size of 10 mm square, by using any second glass ceramics of Samples 101 to 106 each having the composition shown in Table 7 gave superior co-sintering properties.

When the ceramic contained in the second glass ceramic was a zirconate ceramic, as in Samples 101 to 103 shown in Table 7 and a co-sintered body having a size of 100 mm square, superior co-sintering properties were shown with the first glass ceramic of the present invention.

The invention claimed is:

1. A glass ceramic composition comprising:
    a first ceramic powder containing forsterite as a primary component;
    a second ceramic powder containing at least one of strontium titanate and titanium oxide as a primary component;
    2 to 20 percent by weight of a third ceramic powder containing $BaZrO_3$ as a primary component;
    more than 2 up to 20 percent by weight of a fourth ceramic powder containing $SrZrO_3$ as a primary component; and
    3 to 20 percent by weight of a borosilicate glass containing 3 to 15 percent by weight of lithium calculated in the form of $Li_2O$, 20 to 50 percent by weight of magnesium calculated in the form of MgO, 15 to 30 percent by weight of boron calculated in the form of $B_2O_3$, 10 to 35 percent by weight of silicon calculated in the form of $SiO_2$, 6 to 20 percent by weight of zinc calculated in the form of ZnO, and at least 5 percent by weight at least one additive component selected from the group consisting of calcium oxide, barium oxide, and strontium oxide calculated in the form of CaO, BaO, and SrO, respectively,
    wherein the content of the additive component contained in the borosilicate glass powder is up to 15 percent by weight when in the form of CaO, and up to 25 percent by weight when in the form of BaO or SrO, and
    when the second ceramic powder includes the ceramic powder containing strontium titanate as a primary component, the content of strontium titanate is in the range of 3 to 13 percent by weight in the form of $SrTiO_3$, and when the second ceramic powder includes the ceramic powder containing titanium oxide as a primary component, the content of titanium oxide is in the range of 0.3 to 10 percent by weight in the form of $TiO_2$.

2. A glass ceramic composition according to claim 1, wherein the forsterite has a $MgO/SiO_2$ molar ratio of 1.92 to 2.04.

3. A glass ceramic composition according to claim 2, wherein the strontium titanate has a $SrO/TiO_2$ molar ratio of 0.92 to 1.05.

4. A glass ceramic composition according to claim 3, wherein the medium $D_{50}$ value of the first ceramic powder is 1 μm or less, and the specific surface area of the strontium titanate is 1.5 to 7.5 $m^2/g$.

5. A glass ceramic comprising the sintered glass ceramic of claim 4.

6. A glass ceramic comprising the sintered glass ceramic of claim 3.

7. A glass ceramic comprising the sintered glass ceramic of claim 2.

8. A glass ceramic comprising the sintered glass ceramic of claim 1.

9. A glass ceramic sintered body obtained by a process comprising the steps of: forming the glass ceramic composition according to claim 1 into a predetermined shape; and firing the shaped composition at a temperature of 1,000° C. or less.

10. A multilayer ceramic electronic device comprising: a plurality of stacked layers of the glass ceramic according to claim 8; and wiring conductors comprising at least one of copper and silver in association with at least one of the glass ceramic layers.

11. A multilayer ceramic electronic device according to claim 10 in which a pair of the glass ceramic layers sandwich at least one layer of a ceramic having a higher relative dielectric constant than the higher of the pair of glass ceramic layers.

12. A multilayer ceramic electronic device according to claim 11 in which the pair of the glass ceramic layers have a relative dielectric constant of 10 or less, and the layer of a ceramic having a higher relative dielectric constant has a relative dielectric constant of 15 or more.

13. A multilayer ceramic electronic device according to claim 12 in which the layer of a ceramic having a higher relative dielectric constant has a relative dielectric constant of 30 or more.

14. A multilayer ceramic electronic device comprising: a plurality of stacked layers of the glass ceramic according to claim 7; and wiring conductors comprising at least one of copper and silver in association with at least one of the glass ceramic layers.

15. A multilayer ceramic electronic device according to claim 14 in which a pair of the glass ceramic layers sandwich at least one layer of a ceramic having a higher relative dielectric constant than the higher of the pair of glass ceramic layers.

16. A multilayer ceramic electronic device comprising: a plurality of stacked layers of the glass ceramic according to claim 6; and wiring conductors comprising at least one of copper and silver in association with at least one of the glass ceramic layers.

17. A multilayer ceramic electronic device comprising: a plurality of stacked layers of the glass ceramic according to claim 5; and wiring conductors comprising at least one of copper and silver in association with at least one of the glass ceramic layers.

18. A multilayer ceramic electronic device according to claim 17 in which a pair of the glass ceramic layers sandwich at least one layer of a ceramic having a higher relative dielectric constant than the higher of the pair of glass ceramic layers.

19. A multilayer ceramic electronic device according to claim 18 in which the pair of the glass ceramic layers have a relative dielectric constant of 10 or less, and the layer of a ceramic having a higher relative dielectric constant has a relative dielectric constant of 15 or more.

20. A multilayer ceramic electronic device according to claim 19 in which the layer of a ceramic having a higher relative dielectric constant has a relative dielectric constant of 30 or more.

* * * * *